(12) United States Patent
Ettingshausen et al.

(10) Patent No.: US 9,941,256 B1
(45) Date of Patent: Apr. 10, 2018

(54) INVERSE DIODE STACK

(71) Applicant: IXYS Corporation, Milpitas, CA (US)

(72) Inventors: Frank Ettingshausen, Darmstadt (DE); Thomas Spann, Fuerth (DE); Elmar Wisotzki, Darmstadt (DE)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 15/387,582

(22) Filed: Dec. 21, 2016

(51) Int. Cl.
| H01L 25/07 | (2006.01) |
| H01L 23/498 | (2006.01) |
| H01L 23/057 | (2006.01) |
| H01L 29/861 | (2006.01) |
| H01L 23/00 | (2006.01) |
| H03K 17/10 | (2006.01) |
| H01L 29/06 | (2006.01) |
| H01L 23/31 | (2006.01) |

(52) U.S. Cl.
CPC .......... *H01L 25/074* (2013.01); *H01L 23/057* (2013.01); *H01L 23/3121* (2013.01); *H01L 23/49822* (2013.01); *H01L 23/49827* (2013.01); *H01L 23/49838* (2013.01); *H01L 24/29* (2013.01); *H01L 24/83* (2013.01); *H01L 29/0684* (2013.01); *H01L 29/861* (2013.01); *H03K 17/10* (2013.01); *H01L 2224/29139* (2013.01); *H01L 2224/32245* (2013.01); *H01L 2224/33181* (2013.01); *H01L 2224/8384* (2013.01); *H01L 2224/83895* (2013.01); *H01L 2924/10253* (2013.01); *H01L 2924/1203* (2013.01)

(58) Field of Classification Search
CPC .................................................... H01L 25/074
See application file for complete search history.

(56) References Cited

U.S. PATENT DOCUMENTS

| 5,698,454 A | 12/1997 | Zommer ........................... 437/6 |
| 7,442,630 B2 | 10/2008 | Kelberlau et al. ............. 438/510 |
| 7,741,192 B2 | 6/2010 | Shimoyama et al. ......... 438/433 |
| 7,776,672 B2 | 8/2010 | Nakazawa et al. ........... 438/197 |

(Continued)

OTHER PUBLICATIONS

Biermann et al., "New 3300V High Power Emcon-HDR Diode with High Dynamic Robustness," eupec GmbH and Infineon Technologies, Warstein, Germany 2009 (6 pages).

(Continued)

*Primary Examiner* — Daniel Puentes
(74) *Attorney, Agent, or Firm* — Imperium Patent Works; T. Lester Wallace; Darien K. Wallace

(57) ABSTRACT

A packaged inverse diode device exhibits superior commutation robustness. The device includes a stack of inverse diodes disposed within a housing. Each adjacent pair of inverse diodes is bonded together by an intervening DMB (Direct Metal Bonded) substrate structure. At one end of the stack of diode dice and DMB substrate structures is attached a first metal terminal. A second metal terminal is attached to the other end of the stack. The two terminals serve as package terminals of the overall device. In a novel method, the device undergoes severe commutation. A large forward current is made to flow through the diode stack, followed by a rapid reversal of the voltage across the stack to a large reverse polarity voltage. Despite a substantial rate of change of the commutation current at the onset of the reverse voltage condition, the inverse diode device is not damaged.

15 Claims, 3 Drawing Sheets

INVERSE DIODE STACK

(56) References Cited

U.S. PATENT DOCUMENTS 8,835,975 B1 9/2014 Veeramma .................... 257/109
2012/0092912 A1* 4/2012 Eckel ...................... H02M 1/08
  363/123

OTHER PUBLICATIONS

Data sheet for DWN 17-18 Diode Chip, IXYS Corporation Dec. 15, 2015 (2 pages).
Lutz et al., "Semiconductor Power Devices—Physics, Characteristics, Reliability," Springer-Verlag Berlin Heidelberg 2011, ISBN 978-3-642-11124-2, Library of Congress Control No. 2010934110, pp. 146-147 (5 pages).
Data Sheet entitled, "FRED, Rectifier Diode and Thyristor Chips in Planar Design," IXYS Corporation 2004 (5 pages).

* cited by examiner

PACKAGED INVERSE DIODE DEVICE

ONE INVERSE DIODE DIE

INVERSE DIODE STACK

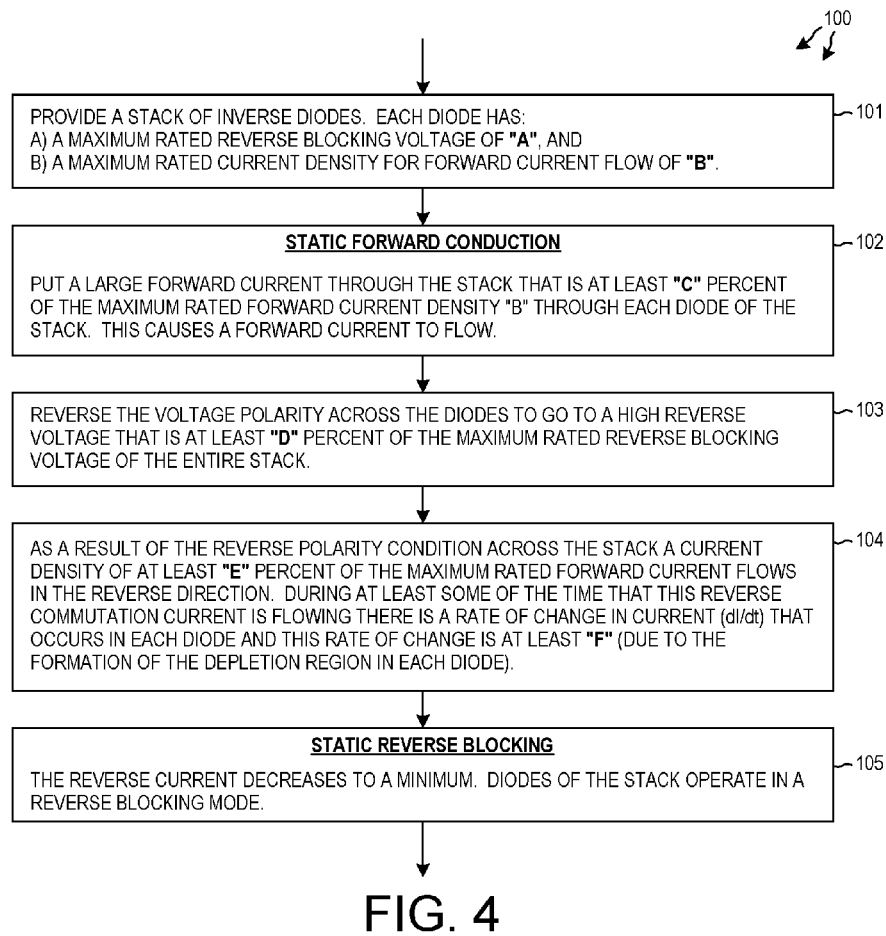

FIG. 4

| A | 1800 VOLTS | MAXIMUM RATED REVERSE BLOCKING VOLTAGE (OF ONE INVERSE DIODE). |
|---|---|---|
| B | 3.1A/mm² (180° rect) | MAXIMUM RATED CURRENT DENSITY FOR FORWARD CURRENT. (IN THE ACTIVE AREA). |
| C | 80% | PERCENTAGE OF MAXIMUM RATED FORWARD CURRENT DENSITY. |
| D | 50% | PERCENTAGE OF MAXIMUM RATED REVERSE BLOCKING VOLTAGE. |
| E | 10% | PERCENTAGE OF THE MAXIMUM FORWARD CURRENT THAT FLOWS IN THE REVERSE DIRECTION DURING THE HIGH REVERSE VOLTAGE CONDITION. |
| F | 2.0A/μsec-mm² | RATE OF CHANGE OF CURRENT DENSITY DURING HIGH REVERSE VOLTAGE CONDITION. (THE RATE OF CHANGE IS AT LEAST THIS VALUE VALUE OF "F") |

VALUES IN THE METHOD OF FIG. 4

FIG. 5

INVERSE DIODE STACK

TECHNICAL FIELD

The described embodiments relate to power semiconductor diode structures and methods, and more particularly to such structures and methods involving inverse diodes.

BACKGROUND AND DISCLOSURE OF PRIOR ART

There are multiple different types of diodes and names for diodes used in the art. To name a few, there are high frequency diodes, low power signal diodes, tunnel diodes, Gunn diodes, power diodes, Schottky diodes, PIN diodes, breakover diodes, soft recovery diodes, fast recovery diodes, avalanche diodes, Zener diodes, light emitting diodes, laser diodes, diodes that have very high reverse voltage blocking ratings, and diodes that are designed to have other unusual performance characteristics. Different diodes can be made out of various different materials. There are many different diode structures.

One specialized prior art application called for a high resistance to diode destruction due to avalanche breakdown. In the application, discrete diodes were coupled together into a string of series-connected discrete diodes. There was initially not a high forward current passed through the string, but rather there was initially either only a small forward current or a reverse voltage that was well below the cumulative rated reverse blocking capability of the series-connected diodes. In the demanding application, however, the series-connected diodes were then subjected to short pulses of a very high reverse voltage. In such a pulse, the very high reverse voltage exceeded the cumulative rated reverse blocking voltage capability of the entire string of diodes. Each diode of the string began avalanche breakdown. Charge carriers started to be generated in the diode due to the avalanche condition, but before the diode could be destroyed the high reverse voltage condition passed. It was found that prior art inverse diodes manufactured by the assignee of this patent document exhibited superior resistance to destruction in the demanding application as compared to other types of diodes, so inverse diodes manufactured by the assignee were utilized. The prior art inverse diodes were DWN diodes as set forth in: 1) the data sheet entitled "Diode Chip", DWN 17-18, by IXYS Corporation of Milpitas, Calif. 95035, USA; and 2) the 2004 description entitled "FRED, Rectifier Diode and Thyristor Chips in Planar Design", by IXYS Semiconductor GmbH, Edisonstrasse 15, D-68623, Lampertheim, Germany.

SUMMARY

In a first novel aspect, a packaged inverse diode device includes a plastic housing, an inverse diode stack, an amount of encapsulant that encapsulates the stack within a container portion of the hosing, and a pair of metal terminals. The stack includes a plurality of inverse diode dice and intervening DMB (Direct Metal Bonded) substrate structures. The dice and DMB substrate structures are coupled together in a stack such that the inverse diode dice are series-connected. A first of the metal terminals is coupled to one end of the stack and a second of the metal terminals is coupled to an opposite end of the stack. The first and second metal terminals are made to extend from the container and to protrude from the encapsulant so that they serve as package terminals of the overall packaged inverse diode device. In one example, the diode dice, the DMB substrate structures, and the terminals are bonded together in a single silver sintering process that simultaneously bonds together all the components of the stack.

Each inverse diode die of the stack has a P type anode region that extends into an N− type semiconductor region of the die from a backside semiconductor surface of the die. The inverse diode die also has an N type cathode region that extends into the N− type semiconductor region of the die from a topside semiconductor surface of the die. The inverse diode die also has a P type edge separation diffusion region that extends from the backside semiconductor surface to the topside semiconductor surface so that the P type edge separation diffusion region laterally surrounds the N− type semiconductor region of the die.

In a second novel aspect, a method involves severe commutation. In a first step of the method, a forward current is conducted through the stack of series-connected inverse diode dice of the packaged inverse diode device. Each inverse diode die of the stack of the device has a maximum rated reverse blocking voltage of at least A and also has a maximum rated current density for forward current flow of B. The density of the forward current is at least C percent of B through each inverse diode die of the stack. In a second step of the method, the voltage polarity across the stack is reversed so that the absolute value of the reverse voltage is at least D percent of A. In a third step of the method, a reverse current is conducted in a reverse direction through the stack as a result of the reversing of polarity of the voltage across the stack. The reverse current has a current density that is at least E percent of B. At least some of the time that the reverse current is flowing there is a rate of change of current density of the reverse current that occurs in each diode of the stack. This rate of change of current density is at least F. The values A through F define conditions of severe commutation that can be endured by the packaged inverse diode device without damaging the device. In the case of one example of the packaged inverse diode device, A is 1800 volts, B is 3.1 amperes/millimeters squared, C is eighty percent, D is fifty percent, E is ten percent, and F is 2.0 amperes per microsecond-millimeters squared.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 4 is flowchart of a method in accordance with another a second novel aspect.

FIG. 5 is a table that sets forth the values of "A" through "F" in one example of the method of FIG. 4.

DETAILED DESCRIPTION

Reference will now be made in detail to background examples and some embodiments of the invention, examples of which are illustrated in the accompanying drawings. In the description and claims below, when a first object is referred to as being disposed "over" or "on" or "covering" a second object, it is to be understood that the first object can be directly on the second object, or an intervening object may be present between the first and second objects. Similarly, terms such as "top", "topside", "bottom", "backside", "side", "up", "upward", "down", "downward", "vertically", "horizontally", "laterally", "lower" and "underneath" describe relative orientations between different parts of the structure being described, and it is to be understood that the overall structure being described can actually be oriented in any way in three-dimensional space.

Figure 1:
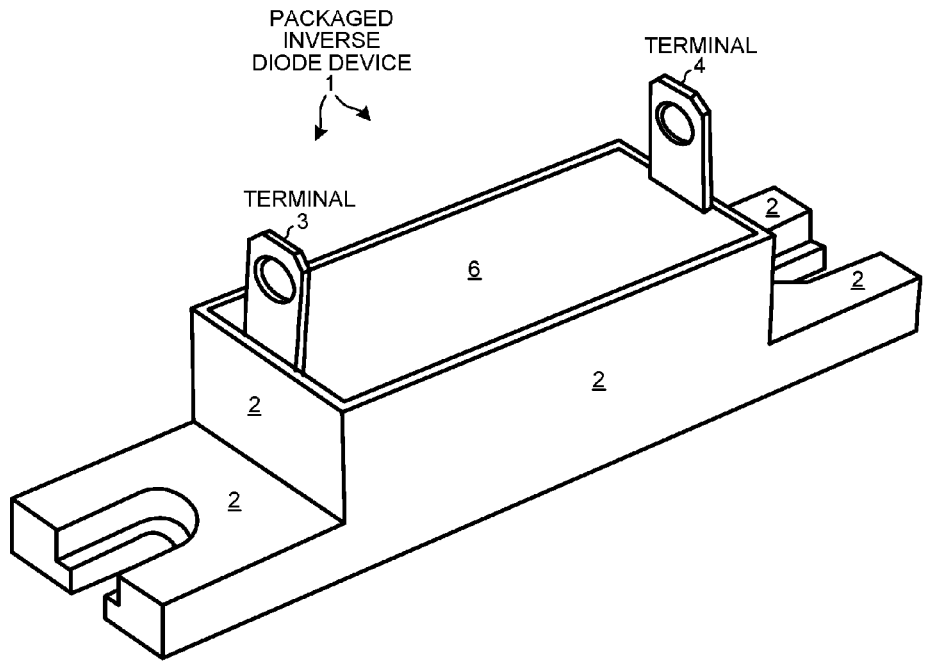
FIG. 1 is perspective diagram of a packaged inverse diode device in accordance with one novel aspect.

FIG. 1 is a perspective diagram of a packaged inverse diode device 1. The packaged inverse diode device 1 includes a plastic housing portion 2, two terminals 3 and 4, a stack of inverse diode dice 5 (not seen in the view of FIG. 1), and an amount of encapsulation 6. In the present example, the encapsulation 6 is a polymer such as hysol or silicon gel. The housing portion 2 forms a box-like tray or open-faced container. The opening of the tray or container in the perspective shown is upward. The stack of diode dice 5 is disposed in the tray or open-face container such that the first metal terminal 7 protrudes upward from the housing above the level of the rim of the tray, and such that the second metal terminal 8 protrudes upward from the housing above the level of the rim of the tray. The encapsulant 6 is poured over and around the stack so as to cover the diodes of the stack and so that the encapsulant fills up the tray to the level of the rim as shown in FIG. 1. The encapsulant then cures or sets.

Figure 2:
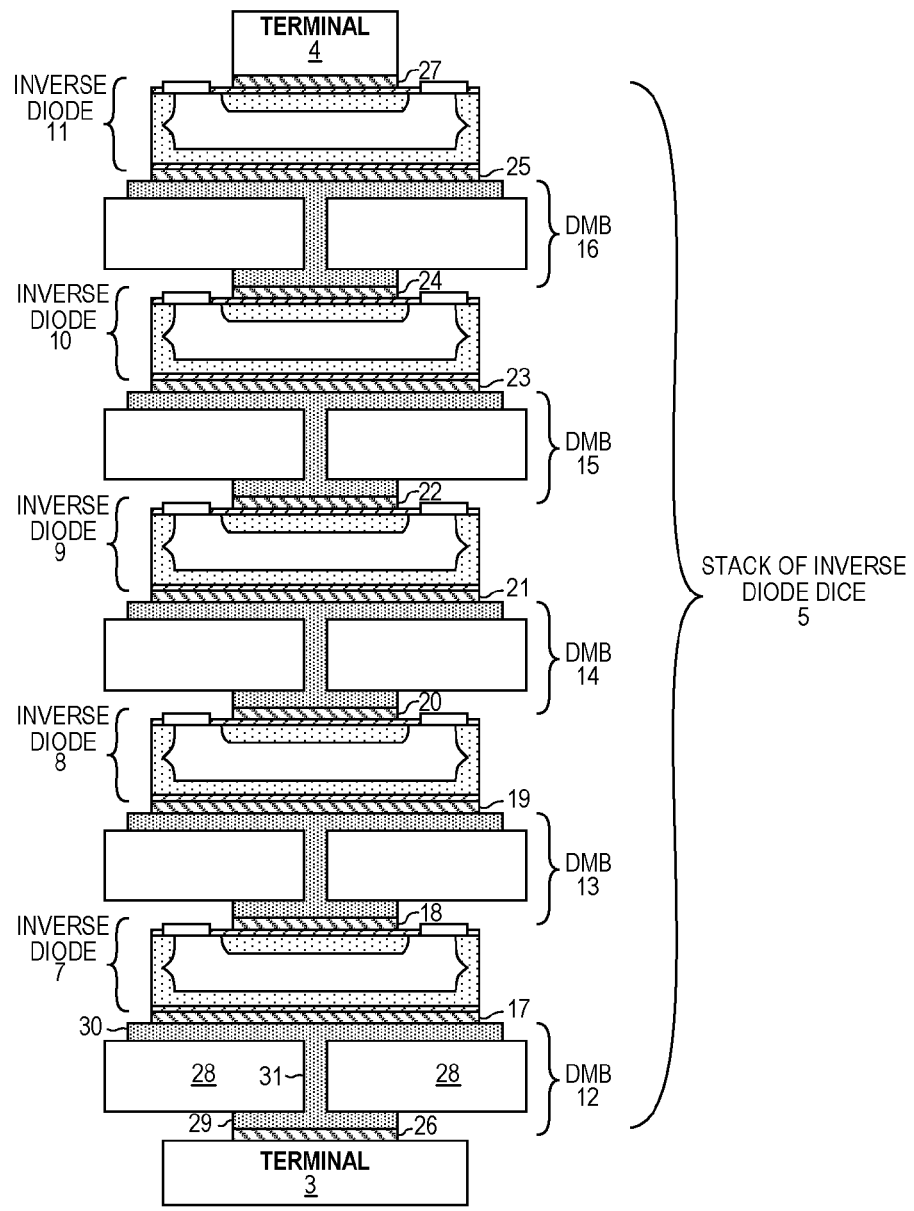
FIG. 2 is a cross-sectional diagram of the inverse diode stack that is disposed within the housing of the packaged inverse diode device of FIG. 1.

FIG. 2 is a cross-sectional side view diagram of the stack of inverse diode dice 5. The first metal terminal 3 is coupled to one end of the stack. The second metal terminal 4 is coupled to the opposite end of the stack. The stack 5 includes five inverse diode dice 7-11, five Direct Metal Bonded (DMB) substrate structures 12-16, and amounts of interconnect metal 17-25. In addition, the metal terminal 3 is coupled to the bottom of DMB substrate structure 12 by another amount of interconnect metal 26, and the metal terminal 4 is coupled to the top of DMB substrate structure 16 by another amount of interconnect metal 27. In the present example, each of the amounts of interconnect metal is an amount of sintered silver that was sintered in a silver sintering die attach-type process to bond together two other parts of the stack. All the DMB substrate structures are of the same identical construction. The detailed structure of only one of the DMB structures, DMB structure 12, is therefore described here. DMB structure 12 includes a central ceramic substrate portion 28, a first metal plate portion 29 that is direct-bonded to a bottom surface of the substrate portion, a second metal plate portion 30 that is direct-bonded to an upper surface of the substrate portion, and a metal via 31 that extends from the first metal plate portion, through the ceramic substrate portion, and to the second metal plate portion. Each of the first and second plate portions includes a thicker metal portion and a thin metal plating layer that covers the thicker metal portion. The central ceramic substrate portion may, for example, be alumina and may be 0.63 mm thick. The thicker metal portions of the first and second metal plate portions may, for example, be copper or aluminum and may be 0.30 mm thick. The thin metal plating layers may, for example, be a palladium layer covered by a nickel layer. If the dice were bonded directly to each other with just a thin layer of intervening solder or sintered silver, then operation of the dice would interfere with one another due to the close proximity of dice to one another. The DMB substrate structures provide attachment of the dice, one to another, as well as desirable physical separation.

Each of the terminals 3 and 4 is a strip of sheet metal. The strip-shaped metal terminal can, for example, be formed a sheet of metal by stamping, etching, or laser cutting. Terminal 4, in the view of the particular cross-section shown in FIG. 2, is approximately as wide as interconnect metal 27. This is also the width of each of the second metal plate portions. As terminal 4 extends upward from inverse diode die 11 and out of the silicone gel passivation 6 (see FIG. 1), it widens so that where it protrudes above the top surface of the silicone gel it is as wide as the other terminal 3 is wide.

Figure 3:
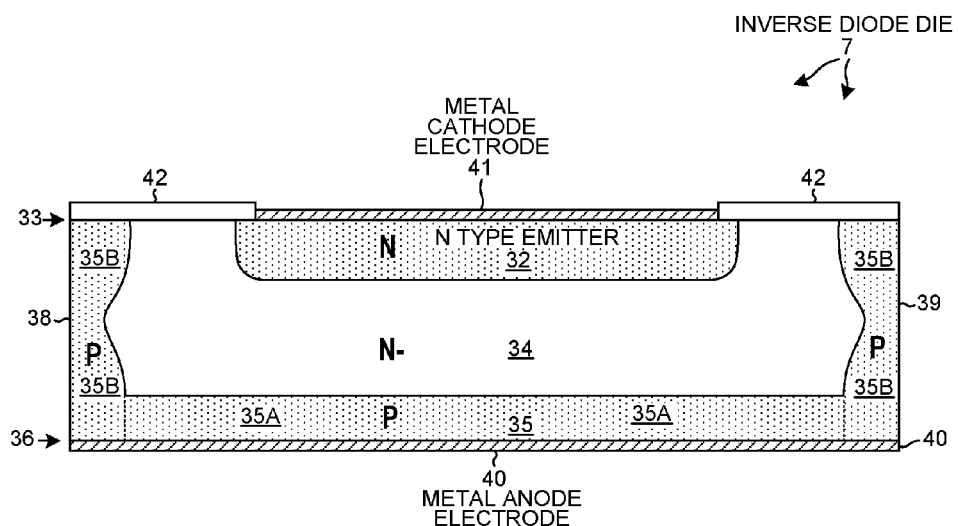
FIG. 3 is a cross-sectional diagram of one of the inverse diode dice of the stack that is disposed within the housing of the packaged inverse diode device of FIG. 1.

FIG. 3 is a cross-sectional diagram of one of the inverse diode dice of the stack, inverse diode die 7. All of inverse diode dice are of the same identical construction. In contrast to the structure of a conventional high voltage diode, the emitter (cathode) of the diode is an N type semiconductor region 32 that is disposed at, and extends downward from, the upper semiconductor surface 33 of the die. The upper semiconductor surface 33 is also referred to as the topside semiconductor surface. This is the die surface that receives the most patterning and diffusion steps during wafer processing, as compared to the backside semiconductor surface 36. Generally the entire backside semiconductor surface 36 is recognized as the surface that is covered entirely in metal. Region 32 extends downward from the upper semiconductor surface 33 and into the N− type bulk substrate semiconductor material 34 of the die. P type region 35A (anode) of the diode is a diffusion region that extends upward from the backside semiconductor surface 36 of the die and into the N− type bulk substrate semiconductor material 34. Reference numeral 35B identifies a P type edge separation diffusion region that extends around the periphery of the die. Part of this region is seen at the left side edge 38 of the cross-section of FIG. 3 and part of this region is seen at the right side edge 39 of the cross-section of FIG. 3. At the time of initial wafer processing in the manufacture of die 7, a first strip of aluminum is provided on the top of the N− type silicon wafer so that the strip extends along what will be the ultimate side edges of the diode die. The four side edges form a square when the die 7 is considered from the top-down perspective. A second strip of aluminum is provided on the opposite side of the wafer, directly underneath the first strip. The two aluminum strips act as a diffusion sources. Under high temperature conditions, aluminum from these strips is made to diffuse into the wafer, thereby forming a downward extending P type region that extends downward from the top of the wafer, and thereby forming an upward extending P type region that extends upward from the bottom of the wafer. The two diffusion fronts of aluminum meet, thereby forming the single P type edge separation diffusion region 35B that extends all the way from the top of the wafer, through the wafer, and to the bottom of the wafer. This edge separation diffusion region 35B separates the active area of the device from what will be the die edge after die singulation. The edge separation diffusion region 35B keeps the high electric fields of the reverse biased depletion region of the diode in the active area from reaching the sidewall edges of the die. For additional information on separation edge diffusion structures and techniques, see: 1) U.S. Pat. No. 7,442,630, entitled "Method For Fabricating Forward And Reverse Blocking Devices," filed Aug. 30, 2005, by Kelberlau et al.; 2) U.S. Pat. No. 5,698,454, entitled "Method Of Making A Reverse Blocking IGBT," filed Jul. 31, 1995, by N. Zommer; and 3) J. Lutz et al., "Semiconductor Power Devices," pages 146-147, published by Springer, Berlin and Heidelberg (2011). The upward extending diffusion region 35A and the edge separation diffusion region 37B together form a P type region 35.

A metal anode electrode 40 is disposed on the backside semiconductor surface 36. A metal cathode electrode 41 is disposed on the upper semiconductor surface 33. A layer of passivation 42 rings and surrounds the metal cathode electrode 41 at the upper semiconductor surface 33 as shown in FIG. 3.

FIG. 4 is a flowchart of a method 100 in accordance with one novel aspect. In a first step (step 101), a stack of inverse diodes is provided. Each inverse diode has: A) a maximum reverse blocking voltage rating of "A", and B) a maximum rated current density for forward current flow of "B". In a second step (step 102), a large forward current is passed through the diode stack. The large forward current is of a magnitude that is at least "C" percent of the maximum rated forward current density "B" through each diode of the stack. Step 102 is a static forward conduction condition. Next (step 103), the voltage polarity across the diode stack is reversed so that a high reverse voltage that is at least "D" percent of the maximum reverse blocking voltage of the entire stack (the absolute value of this reverse voltage is greater than "A" by a factor of at least two). As a result of the reverse polarity condition across the stack, a current density of at least "E" percent of the maximum forward current flows (step 104) in the reverse direction through the stack. During at least some of the time that this reverse current is flowing there is a rate of change in current (dI/dt) that occurs in each diode and this rate of change is at least "F" (due to the formation of the depletion region in each diode). Steps 103 and 104 are a transient condition. Step 103 does not occur entirely before step 104 but rather there is an overlap in time of these steps. After an amount of time, the reverse current decreases to a minimum (step 105) and the diodes of the stack operate in a reverse blocking mode. Step 105 is a static reverse blocking condition.

FIG. 5 sets forth the values of "A" through "F" for the particular embodiment of FIGS. 1-4. To determine the reverse blocking voltage of a device, a reverse blocking voltage is placed across the device and the magnitude of this reverse blocking voltage is increased until the device fails. This is done for a number of devices, and an average of this maximum reverse blocking voltage is obtained. This number is then derated by a derating factor representing the variability of the tested maximum reverse blocking voltages for the devices tested. The derating factor is eighty percent. The resulting number is the maximum rated reverse blocking voltage "A". The number of 1800 given in FIG. 5 is understood to be a negative voltage (as compared to a positive voltage that would be across the diode in a forward current condition). Accordingly, referring to a reverse blocking voltage that is greater than the 1800 volts set forth in FIG. 5 means a voltage that has a larger negative magnitude (for example, minus 2000 volts).

To determine the maximum rated current density for forward current, a static forward current is forced through diode of the stack and the magnitude of this forward current is increased until the junction temperature reaches 150 degrees Celsius. During this procedure the diode is cooled as is typical in the application of the inverse diode stack. The size of the die is known. The measured forward current at the point at which the junction temperature reaches 150 degrees Celsius divided by the die size area is the maximum current density for forward current. There is no need to derate this number because the maximum current density is not very susceptible to changes as a result of manufacturing variability. Accordingly, the measured forward current divided by the die area is also the maximum rated current density forward current "B".

In a typical power diode that is not an inverse diode, a P type anode diffusion region is disposed at the top semiconductor surface of the diode and an N type cathode region is disposed at the bottom semiconductor surface of the diode. Commutation (dI/dt) is generally not extremely fast. If there is an initial high forward current flow (for example, due to a forward current at the maximum rated forward current of the diode) before commutation, then there are charge carriers in the bulk semiconductor material of the die. Some of these charge carriers are initially located directly under the P type anode diffusion region. Others of these charge carriers are initially located under passivation to the sides of the P type anode region between the central cathode region and the side edges of the die. During commutation, when the voltage polarity across the device is switched from a forward voltage to a reverse voltage, the charge carriers are to be removed before the depletion region forms under the influence of the reverse voltage. The charge carriers that happen to be just below the P type anode region can probably escape, but the charge carriers that happen to be in the areas to the sides of the P type anode region have a farther distance to travel downward to reach the cathode electrode on the bottom side of the diode. If commutation is very fast, then these charge carriers may not yet be removed from the side-areas to the sides of the P type anode region by the time the depletion region forms at the principal PN junction of diode. As a result, the remaining charge carriers may be swept across the powerful electric field of the now-formed and expanded depletion region and the applied reverse polarity respectively. These charge carriers are then accelerated as they pass through the depletion region. If the reverse voltage across the diode is very high, then the charge carriers may be accelerated to such a degree that they obtain enough energy to cause avalanche breakdown. Avalanche breakdown due to this mechanism can occur even before the maximum reverse blocking voltage is reached. During such commutation of the diode, even though the maximum rated forward current flow was not exceeded before commutation, and even though the maximum rated reverse blocking voltage was not exceeded at and after commutation, the diode can nonetheless be catastrophically destroyed due to the dynamic avalanche breakdown condition. The ability of the diode device to withstand this type of severe commutation is referred to as "commutation robustness". The packaged inverse diode device of FIGS. 1-3, as compared to a string of typical discrete power diodes of the type described above, exhibits superior commutation robustness. The parameters and values "A" through "F" of FIG. 5 define a range of commutation conditions in which the commutation is particularly severe.

Although certain specific embodiments are described above for instructional purposes, the teachings of this patent document have general applicability and are not limited to the specific embodiments described above. The stack 5 of FIG. 2 is one specific non-limiting example of a rectifier means as explained above in connection with FIGS. 4 and 5, but a means for performing the overall function set forth in FIGS. 4 and 5 can have another structure. For example, the inverse diodes within a packaged inverse diode stack device need not be bonded to DMB structures and need not be bonded to one another so long as adequate electrical continuity through the overall packaged device between its package terminals is maintained. In one example, the diodes of the stack within a packaged inverse diode stack device are held together within the device housing by pressure without the devices being sintered or otherwise bonded together. A stack may include additional conductive elements other than diodes and DMB substrate structures in order to facilitate proper electrical connections within the stack. Accordingly, various modifications, adaptations, and combinations of various features of the described embodiments can be practiced without departing from the scope of the invention as set forth in the claims.

What is claimed is:

1. An apparatus comprising:
a plurality of inverse diode dice, wherein each inverse diode die has a P type anode region that extends into an N− type semiconductor region of the die from a backside semiconductor surface of the die, wherein said each inverse diode die also has an N type cathode region that extends into the N− type semiconductor region of the die from a topside semiconductor surface of the die, and wherein said each inverse diode die also has a P type edge separation diffusion region that extends from the backside semiconductor surface to the topside semiconductor surface so that the P type edge separation diffusion region laterally surrounds the N− type semiconductor region of the die; and
a plurality of Direct Metal Bonded (DMB) substrate structures, wherein each of the DMB substrate structures is bonded to at least one of the inverse diode dice such that the plurality of inverse diode dice are series-connected by the plurality of DMB substrate structures, and wherein the plurality of inverse diode dice and the plurality of DMB substrate structures together form a stack.

2. The apparatus of claim 1, further comprising:
a housing of insulative material, wherein the housing houses the stack;
a first metal terminal coupled to the stack; and
a second metal terminal coupled to the stack such that a forward current can flow in a forward voltage condition from the first metal terminal, through the series-connected inverse diodes and the plurality of DMB substrate structures, and to the second metal terminal.

3. The apparatus of claim 2, further comprising:
amounts of interconnect metal, wherein each amount of interconnect metal bonds a metal plate portion of a DMB substrate structure to another object.

4. The apparatus of claim 2, further comprising:
an amount of encapsulant that covers the stack.

5. The apparatus of claim 2, wherein the housing forms a container portion, wherein the stack is disposed in the container portion, and wherein an amount of encapsulant encapsulated the stack within the container portion.

6. The apparatus of claim 1, wherein each DMB substrate structure comprises:
an insulative central ceramic substrate portion;
a first metal plate portion that is direct-bonded to a bottom surface of the insulative central ceramic substrate portion; and
a second metal plate portion that is direct-bonded to an upper surface of the insulative central ceramic substrate portion.

7. The apparatus of claim 6, wherein said each DMB substrate structure further comprises:
a conductive via that extends from the first metal plate portion, through a hole in the insulative central ceramic substrate portion, and to the second metal plate portion.

8. The apparatus of claim 1, wherein a voltage polarity across the stack reverses during a forward current flow through the series-connected inverse diode dice.

9. The apparatus of claim 1, wherein each of the inverse diode dice has a maximum rated reverse blocking voltage, wherein each of the inverse diode dice has a maximum reverse blocking voltage, and wherein the maximum rated reverse blocking voltage is approximately eighty percent of the maximum reverse blocking voltage.

10. The apparatus of claim 1, wherein a first metal terminal and a second metal terminal are coupled to the stack, wherein an amount of encapsulant covers the stack, and wherein the forward current flows from the first metal terminal, through the series-connected inverse diode dice, to the second metal terminal.

11. A method comprising:
(a) conducting a forward current through a stack of series-connected inverse diode dice, wherein each inverse diode die of the stack has a maximum rated reverse blocking voltage of at least A and also has a maximum rated current density for forward current flow of B, wherein the density of the forward current conducted in (a) is at least C percent of B through each inverse diode die of the stack, wherein each inverse diode die of the stack has a P type anode region that extends into an N− type semiconductor region of the die from a backside semiconductor surface of the die, wherein said each inverse diode die also has an N type cathode region that extends into the N− type semiconductor region of the die from a topside semiconductor surface of the die, wherein said each inverse diode die also has a P type edge separation diffusion region that extends from the backside semiconductor surface to the topside semiconductor surface so that the P type edge separation diffusion region laterally surrounds the N− type semiconductor region of the die, wherein each of a plurality of Direct Metal Bonded (DMB) substrate structures is bonded to at least one of the inverse diode dice such that the plurality of DMB substrate structures and the inverse diode dice are connected together to form the stack, and wherein there is a voltage polarity across the stack during the forward current flow of (a);
(b) reversing the voltage polarity across the stack so that the absolute value of a reverse voltage across the stack is at least D percent of A; and
(c) as a result of the reversing of polarity in (b) temporarily conducting a reverse current in the reverse direction through the stack, wherein the reverse current conducted in (c) has a current density that is at least E percent of B, wherein at least some of the time that the reverse current of (c) is flowing there is a rate of change of the reverse current that occurs in each diode of the stack, wherein this rate of change of current density is at least F, wherein A is 1800 volts, wherein C is 80, wherein D is 50, wherein E is 10, and wherein F is 2.0 amperes per microsecond-millimeters squared.

12. The method of claim 11, further comprising:
(d) after the reverse current flow of (c) operating the stack in a static reverse blocking mode.

13. The method of claim 11, wherein each of the inverse diodes of the stack has a maximum reverse blocking voltage, and wherein the maximum rated reverse blocking voltage is approximately eighty percent of the maximum reverse blocking voltage.

14. The method of claim 11, wherein each of the inverse diodes of the stack has a maximum current density for static forward current flow when a junction temperature of the inverse diode is about 125 degrees Celsius, and wherein the maximum rated current density for forward current flow is the maximum current density for static forward current flow.

15. The method of claim 11, wherein an amount of encapsulant encapsulated the stack.

* * * * *